United States Patent
Farnworth (10) Patent No.: US 6,426,562 B2
(45) Date of Patent: *Jul. 30, 2002

(54) MASK REPATTERN PROCESS

(75) Inventor: Warren M. Farnworth, Nampa, ID (US)

(73) Assignee: Micron Technology, Inc., Bosie, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/921,205

(22) Filed: Aug. 2, 2001

Related U.S. Application Data (63) Continuation of application No. 09/610,643, filed on Jun. 28, 2000, which is a continuation of application No. 08/908,613, filed on Aug. 7, 1997, now Pat. No. 6,147,413, which is a division of application No. 08/767,162, filed on Dec. 16, 1996, now Pat. No. 5,851,911, which is a continuation-in-part of application No. 08/612,059, filed on Mar. 7, 1996, now Pat. No. 6,072,236, and a continuation-in-part of application No. 08/682,141, filed on Jul. 17, 1996, now Pat. No. 9,736,456.

(51) Int. Cl.[7] .......................... H01L 23/48; H01L 23/52; H01L 29/40

(52) U.S. Cl. .................... 257/779; 257/780; 257/781

(58) Field of Search .................. 257/779, 780, 257/781, 777, 625, 624, 778

(56) References Cited

U.S. PATENT DOCUMENTS

| | | |
|---|---|---|
| 3,761,782 A | 9/1973 | Youmans |
| 4,074,342 A | 2/1978 | Honn et al. |
| 4,670,770 A | 6/1987 | Tai |
| 4,709,468 A | 12/1987 | Wilson |
| 4,829,014 A | 5/1989 | Yerman |
| 4,890,157 A | 12/1989 | Wilson |
| 4,948,754 A | 8/1990 | Kondo et al. |
| 5,106,461 A | 4/1992 | Volfson et al. |
| 5,137,845 A | 8/1992 | Lochon et al. |
| 5,198,684 A | 3/1993 | Sudo |
| 5,219,117 A | 6/1993 | Lin |
| 5,224,265 A | 7/1993 | Dux et al. |
| 5,246,880 A | 9/1993 | Reele et al. |
| 5,327,013 A * | 7/1994 | Moore et al. |
| 5,404,265 A | 4/1995 | Moresco et al. |
| 5,436,411 A | 7/1995 | Pasch |
| 5,502,002 A | 3/1996 | Wong et al. |
| 5,505,366 A | 4/1996 | Nishi et al. |
| 5,604,379 A | 2/1997 | Mori |
| 5,677,576 A | 10/1997 | Akagawa |
| 5,719,448 A | 2/1998 | Ichikawa |
| 5,736,456 A | 4/1998 | Akram |
| 5,851,911 A | 12/1998 | Farnworth |
| 6,147,413 A | 11/2000 | Farnworth |
| 6,181,010 B1 * | 1/2001 | Nozawa |
| 6,198,169 B1 * | 3/2001 | Kobayashi et al. |
| 6,232,666 B1 * | 5/2001 | Corisis et al. |
| 6,287,893 B1 * | 9/2001 | Elenius et al. |
| 6,316,839 B1 * | 11/2001 | Farnworth |
| 6,329,608 B1 * | 12/2001 | Rinne et al. |
| 6,340,606 B1 * | 1/2002 | Hashimoto |

* cited by examiner

Primary Examiner—Sheila V. Clark
(74) Attorney, Agent, or Firm—TraskBritt (57) ABSTRACT

The present invention relates to an improved method for forming a UBM pad and solder bump connection for a flip chip which eliminates at least two mask steps required in standard UBM pad forming processes when repatterning the bond pad locations.

11 Claims, 6 Drawing Sheets

MASK REPATTERN PROCESS

CROSS-REFERENCE TO RELATED APPLICATIONS

This application is a continuation of application Ser. No. 09/610,643, filed Jun. 28, 2000, pending, which is a continuation of application Ser. No. 08/908,613, filed Aug. 7, 1997, now U.S. Pat. No. 6,147,413, issued Nov. 14, 2000, which is a divisional of application Ser. No. 08/767,162, filed Dec. 16, 1996, now U.S. Pat. No. 5,851,911, issued Dec. 22, 1998, which is a continuation-in-part of application Ser. No. 08/612,059, filed Mar. 7, 1996, now U.S. Pat. No. 6,072,236, issued Jun. 6, 2000, and application Ser. No. 08/682,141, filed Jul. 17, 1996, now U.S. Pat. No. 5,736,456, issued Apr. 7, 1998.

BACKGROUND OF THE INVENTION

1. Field of the Invention

The present invention relates to a method of repatterning circuits and the like on semiconductor devices. More specifically, the present invention relates to a method for forming conductive bumps on a die for flip-chip type attachment to a printed circuit board or the like after the repatterning of a circuit on a semiconductor device. In particular, the present invention relates to a method for forming under bump metallization pads, which method utilizes simplified or a minimal number of masking steps.

2. State of the Art

The following terms and acronyms will be used throughout the application and are defined as follows:

BGA—Ball Grid Array: An array of minute solder balls disposed on conductive locations of an active surface of a semiconductor die, wherein the solder balls are refluxed for simultaneous attachment and electrical communication of the semiconductor die to conductors of a printed circuit board or other substrate.

Flip-chip: A chip or die that has a pattern or array of terminations spaced around the active surface of the die for face-down mounting of the die to a substrate.

Flip-chip Attachment: A method of attaching a semiconductor die to a substrate in which the die is inverted so that the connecting conductor pads on the face of the device are set on mirror-image pads of conductive traces carried by the substrate and bonded thereto by solder reflux. Also, sometimes known as C4 attachment ("Controlled Collapse Chip Connection").

SLICC—Slightly Larger than Integrated Circuit Carrier: An array of minute solder balls disposed on an attachment surface of a semiconductor die similar to a BGA, but having a smaller solder ball diameter and pitch than a BGA.

High performance microelectronic devices may comprise a number of flip-chips having a BGA or a SLICC attached to a ceramic or silicon substrate or printed circuit board ("PCB") such as an FR4 board for electrical interconnection to other microelectronic devices. For example, a very large scale integration ("VLSI") chip may be electrically connected to a substrate, printed circuit board, or other next higher level packaging carrier member using solder balls or solder bumps. This connection technology may be referred to generically as "flip-chip" or "C4" attachment.

Flip-chip attachment requires the formation of contact terminals at flip-chip contact sites on the semiconductor die, each site consisting of a metal pad with a lead/tin solder ball formed thereon. Flip-chip attachment also requires the formation of solder joinable sites ("pads") on the metal conductors of the PCB or other substrate or carrier which are a mirror-image of the solder ball arrangement on the flip-chip. The pads on the substrate are usually surrounded by non-solderable barriers so that when the solder balls of the chip contact sites are aligned with the substrate pads and "reflow", the surface tension of the liquified solder element supports the semiconductor chip above the substrate. After cooling, the chip is essentially welded face down by very small, closely spaced, solidified solder interconnections. An underfill encapsulant is generally disposed between the semiconductor die and the substrate for environmental protection and to further enhance the mechanical attachment of the die to the substrate.

Figure 1A:
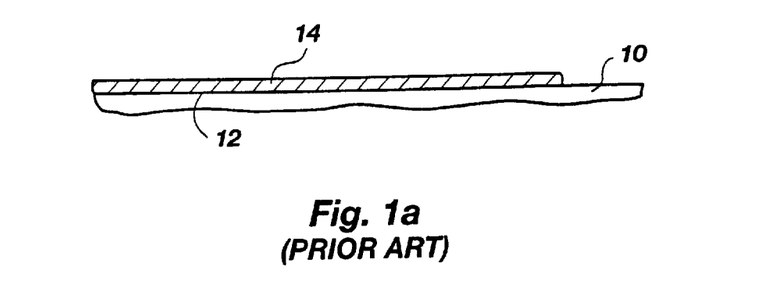
FIGS. 1a–1h are cross-sectional views of a prior art process of forming flip-chip solder bump connections.
Figure 1B:
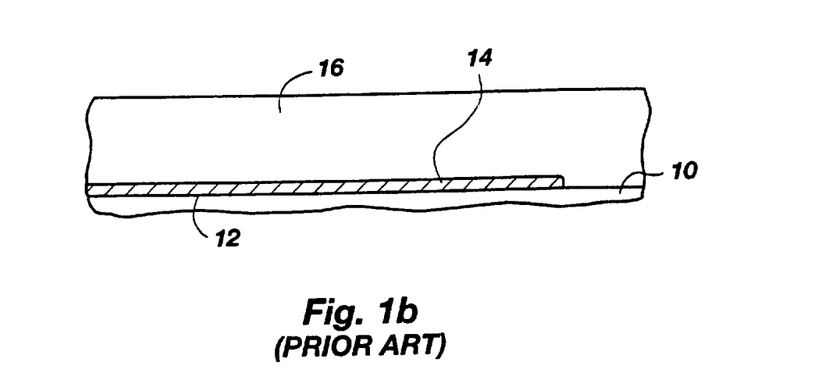
Figure 1C:
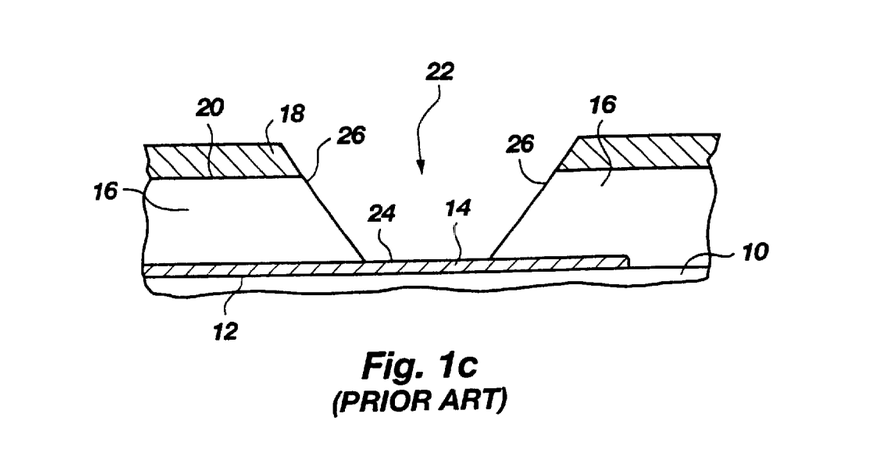
Figure 1D:
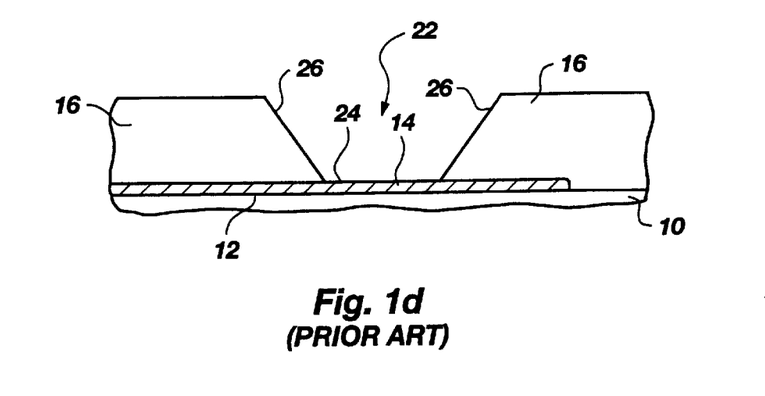

FIGS. 1a–h show a contemporary, prior art method of forming a conductive ball arrangement on a flip-chip. First, a plurality of semiconductor devices, such as dice including integrated circuitry (not shown), is fabricated on a face surface 12 of a semiconductor wafer 10. A plurality of conductive traces 14 is then formed on the semiconductor wafer face surface 12, positioned to contact circuitry of the respective semiconductor elements (not shown), as in FIG. 1a. A passivation film 16, such as at least one layer of $SiO_2$ film, $Si_3N_4$ film, or the like, is formed over the semiconductor wafer face surface 12 as well as the conductive traces 14, as shown in FIG. 1b. A first layer of etchant-resistive photoresist film 18 is subsequently applied to a face surface 20 of the passivation film 16. The first photoresist film 18 is next masked, exposed, and stripped to form desired openings (one illustrated) in the first photoresist film 18. The passivation film 16 is then etched through the opening in photoresist film 18 to form a via 22 with either sloped edges or walls 26, or even substantially vertical walls, and which exposes a face surface 24 of the conductive trace 14, as shown in FIG. 1c. Photoresist 18 is then stripped, as shown in FIG. 1d.

Figure 1E:
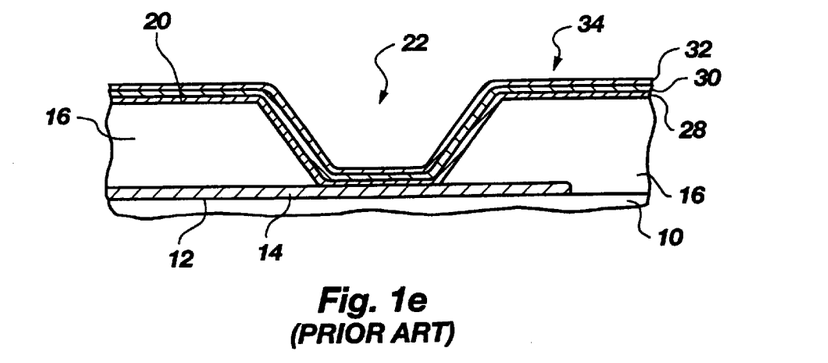

FIG. 1e shows metal layers 28, 30, and 32 applied over the passivation film face surface 20 as well as the via 22 to form a multi-layer under bump metallurgy (UBM) 34 by chemical vapor deposition (CVD), plasma-enhanced chemical vapor deposition (PECVD), physical vapor deposition (PVD), either sputtering or evaporation. The metal layers usually comprise chromium for the first or base adhesion layer 28, chromium-copper alloy for a second, intermediate layer 30, and copper for the third, outer soldering layer 32. Additionally, a fourth metal layer (not shown) of flashed gold is occasionally placed atop the copper third layer 32 to prevent oxidation of the copper. Nickel, palladium, and platinum have also been employed as the outer or soldering layer 32. Furthermore, titanium or titanium/tungsten alloys have been used as alternatives to chromium for the adhesion layer. Two-layer UBMs with a gold flash coating are also known, as are single-layer UBMs.

Figure 1F:
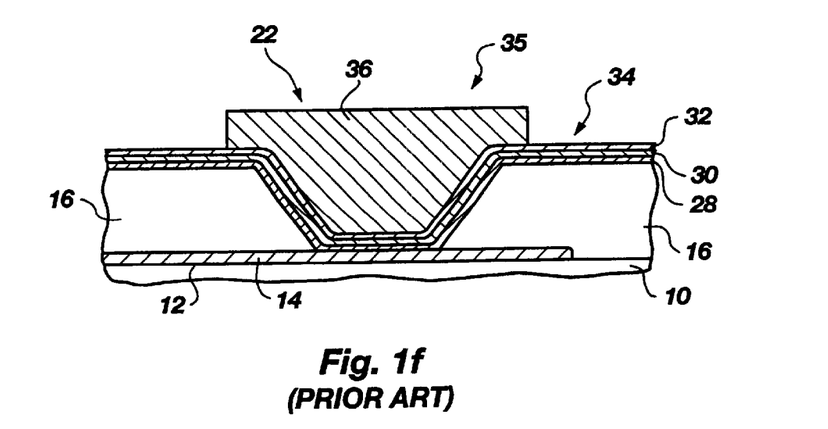
Figure 1G:
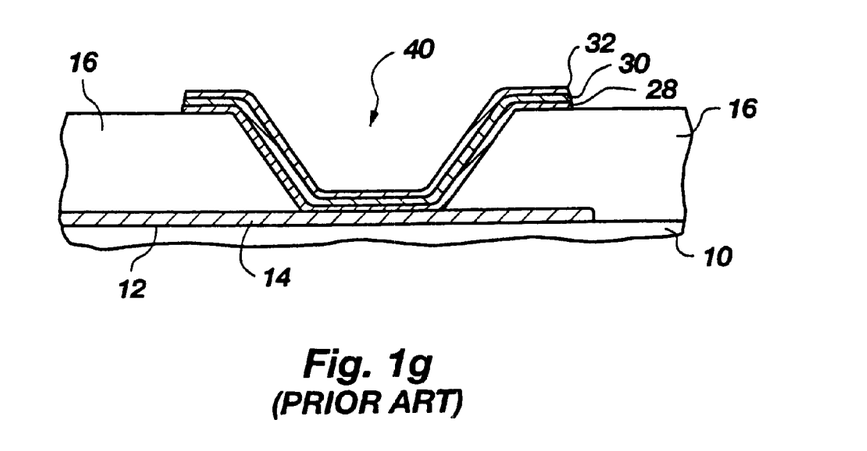
Figure 1H:
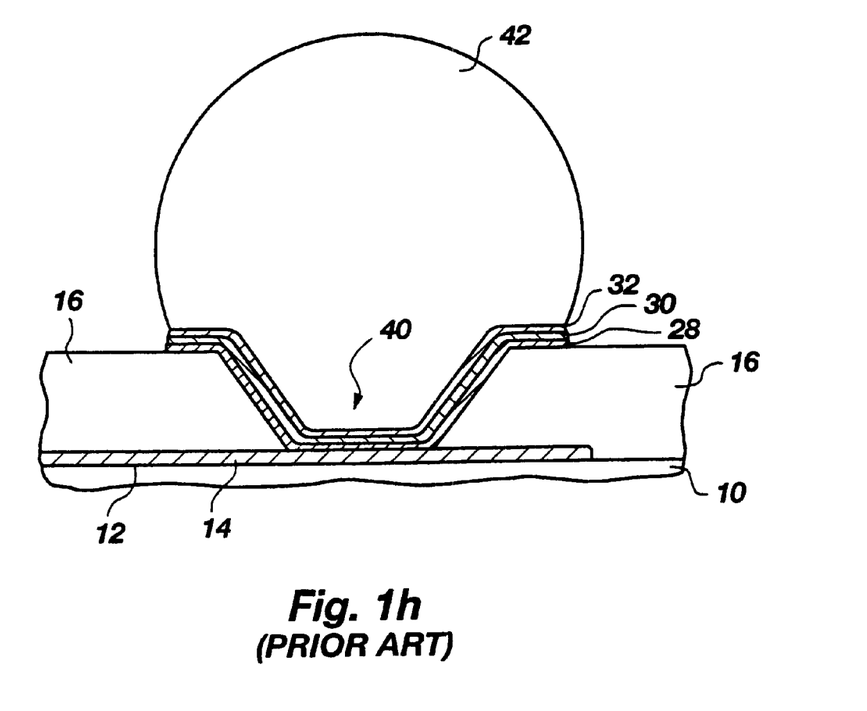

A second layer of etchant-resistive photoresist film 35 is then masked, exposed, and stripped to form at least one second etchant-resistive block 36 over the vias 22, as shown in FIG. if The metal layers 28, 30, and 32 surrounding vias 22 are then etched and the etchant-resistive block 36 is stripped to form a discrete UBM pad 40, as shown in FIG. 1g. A solder bump 42 is then formed on the UBM pad 40, as shown in FIG. 1h, by any known industry technique, such as stenciling, screen printing, electroplating, electroless plating, evaporation or the like.

The UBM pads 40 can also be made by selectively depositing the metal layers by evaporation through a mask (or photoengraving) onto the passivation film face surface 20 as well as the via 22 such that the metal layers 28, 30, and 32 correspond to the exposed portions of the conductive traces 14.

Solder balls are generally formed of lead and tin. High concentrations of lead are sometimes used to make the bump more compatible with subsequent processing steps. Tin is added to strengthen bonding (to such metal as copper) and serves as an antioxidant. High-temperature (melting point of approximately 315 degrees Centigrade) solder alloy has been used to join chips to thick ceramic substrates and multi-layer coffered ceramic interface modules. Joining chips to organic carriers, such as polyamide-glass, polyamide-aramid, and the like, as well as the printed wiring boards, requires lower temperatures which may be obtained by using 63Sn/37Pb solder (melting point 183 degrees Centigrade) and various Pb/In alloys, such as 50Pb/50In (melting point of approximately 220 degrees Centigrade). Lower melting point alloys (down to 60 degrees Centigrade) have been used to bump very temperature-sensitive chips, such as GaAs and superconducting Josephson junctions.

Numerous techniques have been devised to improve the UBM and formation of solder bumps for flip-chips. For example, U.S. Pat. No. 4,360,142, issued Nov. 23, 1982, to Carpenter et al. relates to forming multiple layer UBM pads between a semiconductor device and a supporting substrate particularly suited to high stress use conditions that generate thermal gradients in the interconnection.

U.S. Pat. No. 5,137,845, issued Aug. 11, 1992, to Lochon et al. pertains to a method of forming solder bumps and UBM pads of a desired size on semiconductor chips based on an involved photolithographic technique such that the dimensions of the solder bumps can be reduced in order to increase the number of bumps on a chip.

U.S. Pat. No. 5,470,787, issued on Nov. 28, 1995, to Greer relates to a substantially cylindrical layered solder bump wherein the bump comprises a lower tin layer adjacent to the UBM pad, a thick lead layer, and an upper tin layer to provide an optimized, localized eutectic formation at the top of the bump during solder reflow.

U.S. Pat. Nos. 4,906,341, 5,293,006, 5,341,946, and 5,480,835 also disclose materials and techniques for forming UBM pads and solder bumps.

All of the above patents and prior art techniques for forming UBM pads and solder bumps are relatively complex and require a substantial number of discrete steps and number of masking steps to form the flip-chip conductive bumps. Therefore, it would be advantageous to develop an efficient technique for forming conductive bump structures on a flip-chip to eliminate as many steps as required by present industry standard techniques while using commerciallyavailable, commonly practiced semiconductor device fabrication materials and techniques.

BRIEF SUMMARY OF THE INVENTION

The present invention relates to a method for repatterning circuits and the like on semiconductor devices. The present invention relates to a method for forming under bump metallization pads on semiconductor devices using simplified masking steps.

BRIEF DESCRIPTION OF THE SEVERAL VIEWS OF THE DRAWINGS

The advantages of the invention will be more readily understood from the following description of the invention when taken in conjunction with the accompanying drawings wherein.

DETAILED DESCRIPTION OF THE INVENTION

Figure 2A:
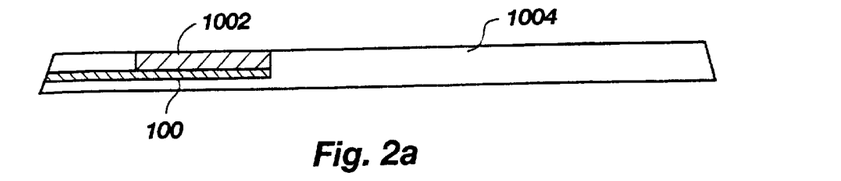
FIGS. 2a–2h illustrate a method for repatterning the active surface of a flip-chip.
Figure 2B:
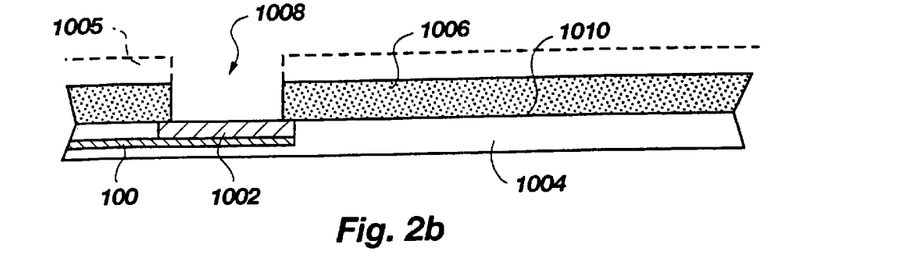

Referring to drawing FIGS. 2a–2h, the method of the present invention for repatterning the circuits on a flip-chip is illustrated. Specifically, referring to drawing FIG. 2a, a semiconductor substrate or wafer 1004 includes a bond pad 1002 connected to a circuit 100. As shown in FIG. 2b, a first layer of passivation film 1006 is applied over a face surface or active surface 1010 of the semiconductor wafer 1004. The first passivation film layer 1006 is preferably a suitable polyamide layer. The polyamide passivation film layer 1006 is typically formed by spin coating a mixture of diamine and dianhydride monomers in a solvent, usually N-methyl-pyrrolidine 2 (NMP). Depending upon the predetermined formulation of the polyamide, the thickness of the polyamide coating is directly related to the speed of rotation of the wafer. The monomers combine at low temperature to form polyamic acid, which is soluble in NMP. The passivation film is subsequently dried at approximately 100° C. to initially remove most of the solvent and further dried at 250–400° C. to ensure complete solvent removal and the conversion to polyamide. If the pyromellitic dianhydride-oxydianiline (PMDA-ODA) family of polyamides is used, such polyamides are isotropic in behavior, while long polymer chain biphenyldiaminine-phenyldiamine (BPDA-PDA) polyamides tend to be anisotropic in mechanical and electrical properties. Either type of polyamide can be used for the passivation layer. In this manner the polyamide is capable of absorbing the thin film stresses imparted from the deposition of the interconnection by the solder.

Still referring to drawing FIG. 2b, a photoresist 1005 is applied, masked and exposed (broken lines). The polyamide passivation film layer 1006 is then etched, using well-known etching techniques, to form a bond pad via 1008 through the polyamide passivation film layer 1006 to the bond pad 1002, as shown.

Figure 2C:
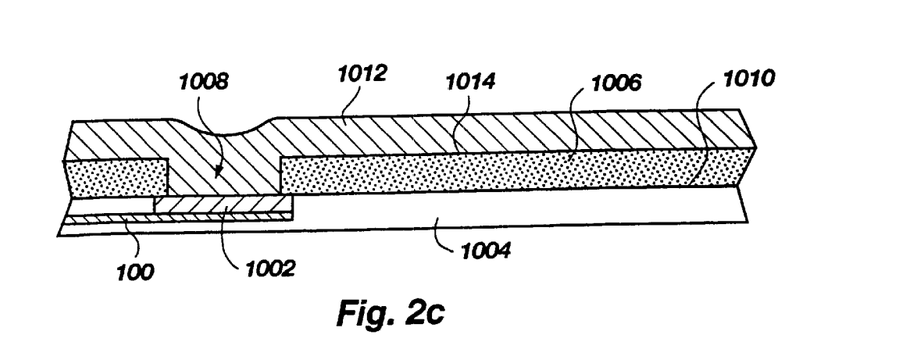
Figure 2D:
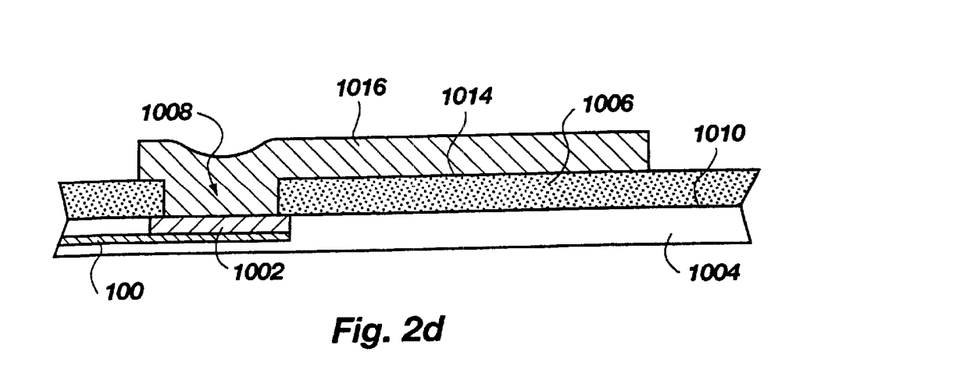

Referring to drawing FIG. 2c, a conductive layer 1012, preferably a solder wettable metal, is applied over a face surface 1014 of the polyamide passivation film layer 1006. The conductive layer is preferably a metal such as copper, nickel, palladium, platinum, gold, or alloys thereof that is capable of being easily wetted by solder and alloys thereof Referring to drawing FIG. 2d, the conductive layer 1012, shown in FIG. 2c, is photoresist-coated, masked, exposed, and etched, using well-known techniques, to form at least one conductive repattern trace 1016 extending to a substitute or alternative bond pad location, as shown in FIG. 2d.

Figure 2E:
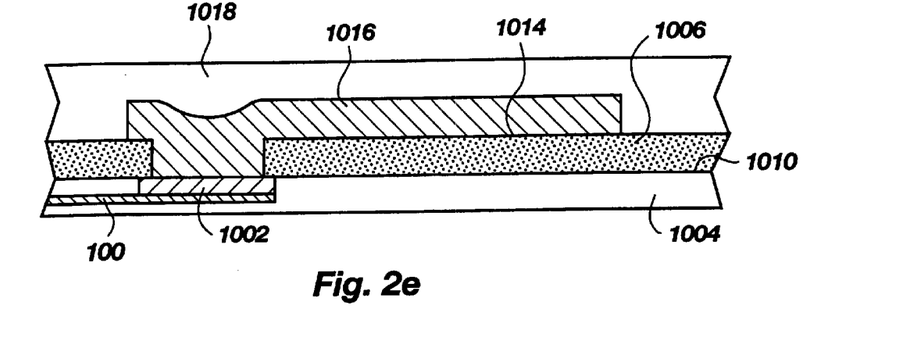

Referring to drawing FIG. 2e, a second passivation film layer 1018, such as a spin-on polyamide layer described hereinbefore, is applied over the conductive repattern trace 1016, as shown.

Figure 2F:
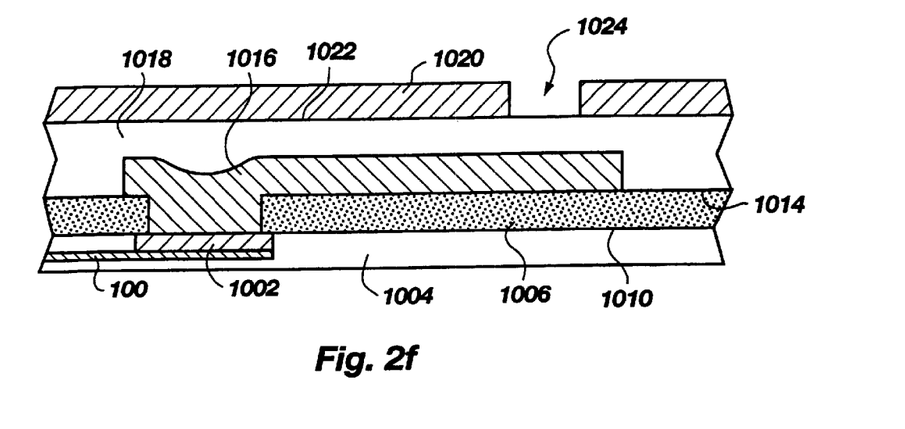

Referring to drawing FIG. 2f, a suitable etch-resistant layer 1020 (photoresist) is applied over an upper surface 1022 of the second passivation film layer 1018, masked, and etched to form a resist via 1024 at the alternative, repatterned bond pad location, as shown.

Figure 2G:
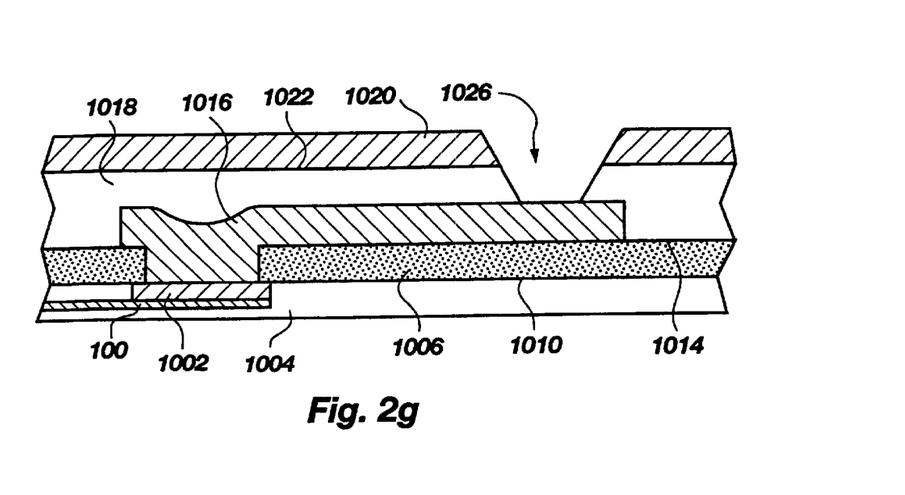

Referring to drawing FIG. 2g, a faceted or sloped-wall via 1026 is shown as etched according to the following preferred processes. A sputter etching process for forming sloped-wall vias 1026 begins with providing a semiconductor wafer assembly comprising a semiconductor wafer with a plurality of semiconductor elements (dice) including integrated circuitry formed on the face (active) surface and with the plurality of conductive traces and bond pads also formed on the semiconductor wafer face surface positioned to contact respective semiconductor element circuitry. A passivation film is disposed over the semiconductor wafer face surface, as well as the conductive traces and pads. A first layer of etch-resist film, such as a photoresist, is applied to the face surface of the passivation film, then masked, exposed, and stripped to form desired openings in the first etch-resist film. After a short period of time being subjected to sputter etching, sloped edges begin to form on the etch-resist film as the wafer is sputtered and both resist film and passivation film are etched. The sputtering process continues and sloped edges or walls begin to form in the passivation film after the resist is penetrated.

Alternately, a wet etching process for forming vias may be used. The process begins with providing a semiconductor wafer assembly comprising a semiconductor wafer with a plurality of semiconductor elements or circuitry formed on the face surface and with the plurality of conductive traces and bond pads also formed on the semiconductor wafer face surface positioned to contact respective semiconductor element circuitry. A passivation film is disposed over the semiconductor wafer face surface, as well as the conductive traces and pads. A first layer of etch-resist film (photoresist or other film, depending upon the intended etchant and temperature) is applied to the face surface of the passivation film. The first etch-resist film is then masked, exposed, and stripped to form desired openings in the first etch-resist film.

An appropriate acid, such as a 1:2 ratio mix of ammonium fluoride and acetic acid, or a 100:1 ratio mix of $H_2O$ and HF acid for etching an SiO film, or hot (150–180° C.) phosphoric acid in the case of an $Si_3N_4$ film, is then applied to the surface of the wafer. Other suitable etchants, as known in the art, may be employed in the case of polymer-based films, such as polyamides. After a short period of time of etching, a concave recess begins to form on the passivation film. The process continues until the etching forms the sloped via having somewhat arcuate or curved sloped edges and which exposes the face surface of the conductive electrode. Resist is then stripped. An etch, performed as described above, forms a wall angle of the via with respect to the horizontal which is desirable for solder ball formation by increasing surface area exposed to shear forces. Thus, as shown, a UBM structure is formed.

Figure 2H:
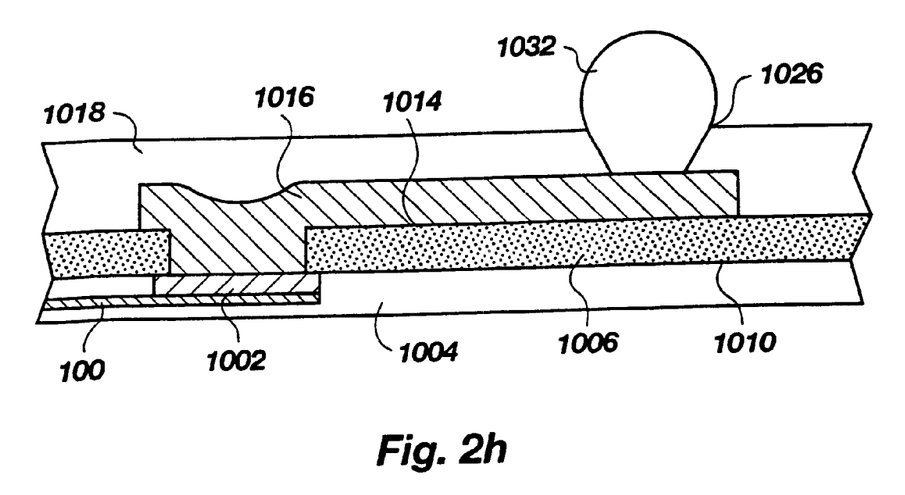

Referring to drawing FIG. 2h, a solder ball 1032 is formed in the sloped-wall via 1026 in contact with the conductive repattern trace 1016.

It is, of course, understood that, although the above description is generally directed to fabrication on a wafer scale, the method is equally applicable to single chips or portions of wafers.

It will also be understood that a solid preform comprising a "blank" of substrate material (such as Si) may be employed over the exposed trace ends of the wafer to define vias anisotropically wet-etched and plated with metal to define the UBM. For purposes of this invention, a preform Si blank may also be considered as a passivation layer. Techniques for such via and UBM formation are disclosed in co-pending U.S. patent application Ser. No. 08/612,159, filed Mar. 7, 1996 and assigned to the assignee of the present invention, the disclosure of which is incorporated herein by this reference. The anisotropic wet etch of the silicon blank may be effected by a $KOH:H_2O$ mixture, resulting in a preferred 54° via wall angle to the horizontal for formation of a solder ball therein.

Having thus described in detail the preferred embodiment of the present invention, it is to be understood that the invention defined by the appended claims is not to be limited by particular details set forth in the above description, as many apparent variations thereof are possible without departing from the spirit or scope thereof.

What is claimed is:

1. A semiconductor device, said semiconductor device comprising:

a semiconductor substrate including a plurality of circuits thereon, each circuit of said plurality of circuits connected to a bond pad, a first passivation layer thereon covering said plurality of circuits and having an aperture therethrough at each said bond pad, a plurality of solder wettable conductive traces, each trace of said plurality of solder wettable conductive traces having a portion thereof connected to said bond pad and having said portion thereof located on a portion of said first passivation layer, a second insulative passivation layer comprising a polyamide material covering said plurality of solder wettable conductive traces and said portion of said first passivation layer, said second insulative passivation layer including a plurality of sloped-wall vias therethrough located over said portion of said each of said plurality of solder wettable conductive traces, and a solder material located in each sloped-wall via of said plurality of sloped-wall vias in said second insulative passivation layer, said solder material directly contacting said portion of at least one solder wettable conductive trace of said plurality of solder wettable conductive traces, said at least one sloped wall via of said plurality of sloped-wall vias including:

said portion of said at least one solder wettable conductive trace of said plurality of solder wettable conductive traces directly contacting said solder material, said at least one solder wettable conductive trace of said plurality of solder wettable conductive traces in electrical communication with integrated circuitry carried by said semiconductor substrate connected to at least one circuit of said plurality of circuits.

2. The semiconductor device of claim 1, wherein said plurality of solder wettable conductive traces are formed by selective removal of a metal layer over said first passivation layer and extending into said each sloped-wall via of said plurality of sloped-wall vias, said selective removal being effected by etching said metal layer over said first passivation layer.

3. The semiconductor device of claim 1, wherein said second insulative passivation layer comprising said polyamide material includes a polyamide material for absorbing stresses.

4. The semiconductor device of claim 3, wherein said polyamide material includes an isotropic polyamide material.

5. The semiconductor device of claim 3, wherein said polyamide material includes an anisotropic polyamide material.

6. A semiconductor device, said semiconductor device comprising:

a semiconductor substrate including at least one circuit thereon connected to a bond pad, a first passivation layer thereon covering said at least one circuit and having an aperture therethrough located at said bond pad, at least one solder wettable conductive trace having a portion thereof connected to said bond pad and located on a portion of said first passivation layer, a second passivation layer including a stress absorbing insulation material covering said at least one solder wettable conductive trace and said portion of said first passivation layer, said second passivation layer including at least one sloped-wall via therethrough located over said portion of said at least one solder wettable conductive trace, and a solder material located in said at least one sloped-wall via in said second passivation layer, said solder material directly contacting said portion of said at least one solder wettable conductive trace, said at least one sloped-wall via including:
said portion of said at least one solder wettable conductive trace directly contacting said solder material, said at least one solder wettable conductive trace in electrical communication with integrated circuitry carried by said semiconductor substrate connected to said at least one circuit.

7. A semiconductor device, said semiconductor device comprising:
a semiconductor substrate including at least one circuit thereon connected to a bond pad, a first passivation layer thereon covering said at least one circuit and having an aperture therethrough located at said bond pad, at least one solder wettable conductive trace having a portion thereof connected to said bond pad and located on a portion of said first passivation layer, a substantially non-conductive second passivation layer including a stress absorbing material covering said at least one solder wettable conductive trace and said portion of said first passivation layer, said substantially non-conductive second passivation layer including at least one sloped-wall via therethrough located over a portion of said at least one solder wettable conductive trace, and a solder material located in the at least one sloped-wall via in said non-conductive second passivation layer, said solder material directly contacting the portion of said at least one solder wettable conductive trace, said at least one sloped wall via including:
the portion of said at least one solder wettable conductive trace directly contacting said solder material, said at least one solder wettable conductive trace connected with integrated circuitry of said semiconductor substrate connected to said at least one circuit.

8. A semiconductor device comprising:
a semiconductor substrate including at least one circuit thereon connected to a bond pad, a first passivation layer thereon covering said at least one circuit and having an aperture therethrough at said bond pad, at least one solder wettable conductive trace having a portion thereof connected to said bond pad and located on a portion of said first passivation layer, a second passivation layer including a stress absorbing material without conductive particles therein covering said at least one solder wettable conductive trace and said portion of said first passivation layer, said second passivation layer including at least one sloped-wall via therethrough over said portion of said at least one solder wettable conductive trace, and a solder material located in said at least one sloped-wall via in said second passivation layer, said solder material directly contacting said portion of said at least one solder wettable conductive trace, said at least one sloped-wall via including:
said portion of said at least one solder wettable conductive trace directly contacting said solder material, said at least one solder wettable conductive trace connected to integrated circuitry of said semiconductor substrate connected to said at least one circuit.

9. A semiconductor device comprising:
a semiconductor substrate including at least one circuit thereon connected to a bond pad, a first passivation layer thereon covering said at least one circuit and having an aperture therethrough located at said bond pad, at least one solder wettable conductive trace having a portion thereof connected to said bond pad and located on a portion of said first passivation layer, a second passivation layer including a stress absorbing material without particles therein covering said at least one solder wettable conductive trace and said portion of said first passivation layer, said second passivation layer including at least one sloped-wall via therethrough located over said portion of said at least one solder wettable conductive trace, and a solder material located in said at least one sloped-wall via in said second passivation layer, said solder material directly contacting said portion of said at least one solder wettable conductive trace, said at least one sloped-wall via including:
said portion of said at least one solder wettable conductive trace directly contacting said solder material, said at least one solder wettable conductive trace connected to said at least one circuit.

10. A semiconductor device comprising:
a semiconductor substrate including at least one circuit thereon connected to a bond pad, a first passivation layer thereon covering said at least one circuit and having an aperture therethrough located at said bond pad, at least one solder wettable conductive trace having a portion thereof connected to said bond pad and located on a portion of said first passivation layer, a second passivation layer including a stress absorbing material having no particles therein covering said at least one solder wettable conductive trace and said portion of said first passivation layer, said second passivation layer including at least one sloped-wall via therethrough located over said at least one solder wettable conductive trace, and a solder material located in said at least one sloped-wall via in said second passivation layer, said solder material directly contacting said portion of said at least one solder wettable conductive trace, said at least one sloped-wall via including:
said portion of said at least one solder wettable conductive trace directly contacting said solder material, said at least one solder wettable conductive trace connected to said at least one circuit.

11. A semiconductor device comprising:
a semiconductor substrate including at least one circuit thereon connected to a bond pad, a first passivation layer thereon covering said at least one circuit and having an aperture therethrough located at said bond pad, at least one solder wettable conductive trace having a portion thereof connected to said bond pad and located on a portion of said first passivation layer, a second passivation layer of stress absorbing material having no conductive particles therein covering said at least one solder wettable conductive trace and said portion of said first passivation layer, said second passivation layer including at least one sloped-wall via therethrough located over said portion of said at least one solder wettable conductive trace, and a solder material located in said at least one sloped-wall via in said second passivation layer, said solder material directly contacting said portion of said at least one solder wettable conductive trace, said at least one sloped-wall via including:

said portion of said at least one solder wettable conductive trace directly contacting said solder material, said at least one solder wettable conductive trace connected to said at least one circuit.

* * * * *

UNITED STATES PATENT AND TRADEMARK OFFICE
CERTIFICATE OF CORRECTION

PATENT NO. : 6,426,562 B2 Page 1 of 1
APPLICATION NO. : 09/921205
DATED : July 30, 2002
INVENTOR(S) : Warren M. Farnworth

It is certified that error appears in the above-identified patent and that said Letters Patent is hereby corrected as shown below:

On the title page:
In ITEM (63) "Related U.S. Patent
  Application Data,"        9th LINE,      change "9,736,456." to --5,736,456.--
In ITEM (57) "Abstract"      LINES 2-3,    change "flip chip" to --flip-chip--

In the specification:
           COLUMN 4,    LINE 22,     change "100° C." to --100° C--
           COLUMN 4,    LINE 24,     change "250–400° C." to --250–400° C--

Signed and Sealed this

Fifth Day of June, 2007

JON W. DUDAS
*Director of the United States Patent and Trademark Office*